United States Patent
Pearce (10) Patent No.: US 7,206,343 B2
(45) Date of Patent: Apr. 17, 2007

(54) HIGH RESOLUTION DIGITAL PULSE WIDTH MODULATOR FOR DC-DC VOLTAGE CONVERTER

(75) Inventor: Lawrence G. Pearce, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 909 days.

(21) Appl. No.: 10/350,599

(22) Filed: Jan. 24, 2003

(65) Prior Publication Data

US 2004/0146101 A1   Jul. 29, 2004

(51) Int. Cl.
*H03H 7/30* (2006.01)
*H03K 5/159* (2006.01)

(52) U.S. Cl. ............... 375/238; 375/259; 327/158; 327/159

(58) Field of Classification Search ............... 375/238, 375/237, 239, 259, 353, 241, 254, 260, 339; 331/57, 185; 327/158, 159; 330/297, 10; 323/282, 290; 324/713
See application file for complete search history.

(56) References Cited

U.S. PATENT DOCUMENTS

| 4,717,889 | A  | * | 1/1988  | Engelmann ................ 330/297 |
| 4,980,838 | A  | * | 12/1990 | Daggett et al. ........ 318/568.16 |
| 6,535,043 | B2 | * | 3/2003  | Chen ........................ 327/291 |
| 6,778,603 | B1 | * | 8/2004  | Fullerton et al. ........... 375/238 |
| 2001/0028504 | A1 | * | 10/2001 | Schierbeek ................ 359/603 |
| 2002/0101769 | A1 | * | 8/2002  | Gaverick et al. .......... 365/200 |

* cited by examiner

*Primary Examiner*—Mohammed Ghayour
*Assistant Examiner*—Qutub Ghulamali
(74) *Attorney, Agent, or Firm*—Akerman Senterfitt; Neil R. Jetter (57) ABSTRACT

A digitally-implemented pulse width modulation (PWM) signal generator forms the PWM pulse width as a rational number based on full cycles of a PWM reference clock, and offers a very high effective resolution of the PWM pulse signal that is compatible with multiphase DC-DC converters. Being totally digital allows digital error accumulation and correction to occur at the point of origin of the PWM signal, well upstream of the relatively slow voltage control feedback loop. Quantization errors are corrected before they can accumulate in the converter's DC output voltage.

29 Claims, 5 Drawing Sheets

HIGH RESOLUTION DIGITAL PULSE WIDTH MODULATOR FOR DC-DC VOLTAGE CONVERTER

CROSS-REFERENCE TO RELATED APPLICATION

The present invention relates to subject matter disclosed in co-pending U.S. patent application Ser. No. 10/315,836 filed on Dec. 10, 2002, by L. Pearce et al, entitled: "Robust Fractional Clock-Based Pulse Generator for Digital Pulse Width Modulator" (hereinafter referred to as the '836 application), assigned to the assignee of the present application and the disclosure of which is incorporated herein.

FIELD OF THE INVENTION

The present invention relates in general to electronic circuits and components therefor, and is particularly directed to a digitally-based pulse width modulator (PWM) circuit, that forms a PWM pulse width as a rational number based on full cycles of a PWM reference clock, so as to provide high resolution digital control of the operation of a DC-DC voltage converter. Digital error accumulation and correction occur at the point of origin of the PWM signal, upstream of the relatively slow output filter and voltage control feedback loop, whereby quantization errors are corrected before they can accumulate in the converter's output voltage.

BACKGROUND OF THE INVENTION

Figure 1:
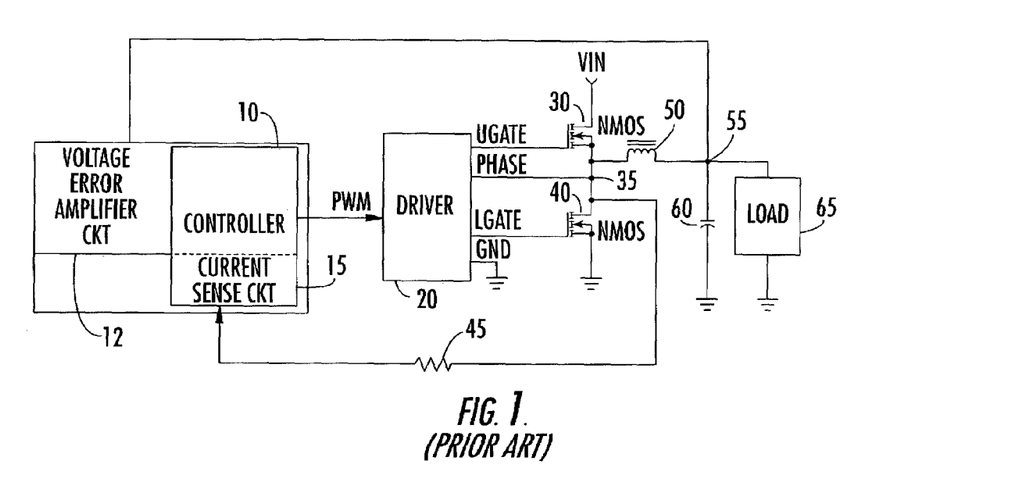
FIG. 1 diagrammatically illustrates a conventional, single-phase, buck-mode, pulse width modulation (PWM) based, DC-DC converter.

As described in the above-referenced '836 application, electrical power for an integrated circuit (IC) is typically supplied by one or more direct current power sources, such as a buck-mode, pulse width modulation (PWM) based, DC-DC converter of the type diagrammatically shown in FIG. 1. As shown therein, a PWM control circuit 10 supplies a PWM signal to a switching circuit driver 20, that controls the turn-on and turn-off of a pair of electronic power switching devices, to which a powered load is coupled. In the illustrated DC-DC converter, the electronic power switching devices are depicted as an upper (or high side) power NMOSFET (or NFET) device 30, and a lower (or low side) power NFET device 40, having their drain-source current flow paths connected in series between a pair of power supply rails (e.g., VIN and ground (GND)).

The upper NFET device 30 is turned on and off by an upper gate switching signal UGATE applied to its gate from driver 20, while the lower NFET device 40 is turned on and off by a lower gate switching signal LGATE supplied from driver 20. A common node 35 between the two NFETs is coupled through an inductor 50 to a load reservoir capacitor 60 that is coupled to a reference voltage terminal (GND). The connection 55 between inductor 50 and capacitor 60 serves as an output node 55 from which a desired (regulated) DC output voltage Vout is applied to a LOAD 65 (coupled to GND).

The output node connection 55 is also fed back to error amplifier circuitry 12 within the PWM controller 10. The error amplifier circuitry is used to regulate the converter's output DC voltage relative to a reference voltage supply. In addition, the common node 35 between the controllably switched NFETs is coupled (as by way of a sense feedback resistor 45) to current-sensing circuitry 15 within the controller 10. The controller adjusts duty ratio of the PWM signal, as necessary, to maintain the converter's DC output within a prescribed set of parameters.

The controller 10 of FIG. 1 can be implemented with either analog or digital circuits. The digital implementation is desirable for all the reasons that have historically favored digital signal processing techniques, but there is a penalty. A digital controller produces a quantized PWM pulse width, i.e., the PWM pulse width has an irreducible temporal granularity associated with the finite bit length of the digital implementation. The digital PWM granularity imposes performance limitations on the DC-DC regulator in a manner similar to noise in the analog PWM pulse generation. Electronic circuits and systems powered by PWM-based DC-DC converters of the type shown in FIG. 1 require precise DC-DC regulation, and the required precision of regulation is tightening with each successive generation of circuits and systems. Consequently, it is desirable to have high digital resolution (small temporal granularity) of the PWM pulse by which the duty-cycle of the PWM signal may be (digitally) adjusted to translate (e.g., step down) the supply voltage (e.g., 12 VDC) to a prescribed regulated fraction thereof (e.g., one-eighth or a 1.5 VDC regulated output voltage).

Ostensibly, this may be accomplished by controlling the operation of the digital PWM pulse generator with a clocking frequency that is a multiple of the switching frequency to which the PWM generator is referenced. As a non-limiting example, consider the case of a switching frequency of 1 MHz, a digital clock frequency of 100 MHz, and a nominal PWM duty-cycle of 10%. The digital clock cycle resolution limits the actual duty-cycle to P/100, where P is an integer number of clock cycles that make up a single PWM pulse, and 100 is the number of clock cycles in a switching period. This means that the duty-cycle resolution in the vicinity of the nominal value PWM duty-cycle of 10% is +/−1%, namely 9% or 11%. In either case the actual digital granularity is very coarse, +/−10% when considered as a fraction of the nominal 10% duty-cycle.

One way to improve upon this relatively coarse digital resolution is to increase the ratio of the reference clock signal to the PWM switching frequency—either by decreasing the switching frequency and/or increasing the frequency of the reference clock signal. In the above example, a finer granularity/resolution on the order of 0.1% of duty-cycle, or 1% of the nominal 10% duty-cycle, could be obtained by decreasing the PWM switching frequency to 100 KHz (while maintaining the reference clock frequency at 100 MHz), or increasing the reference clock frequency to 1 GHz (while maintaining the PWM switching frequency at 1 MHz). Unfortunately, both choices obviously result in impractical solutions in light of other system requirements and limitations.

Figure 2:
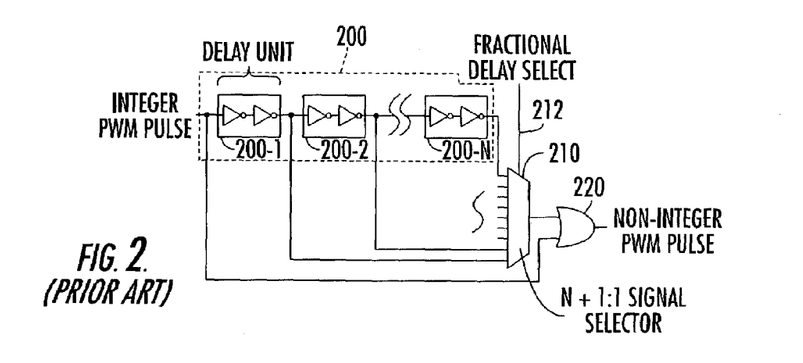
FIG. 2 diagrammatically illustrates a conventional tapped delay line-based digital PWM pulse generator.
Figure 3:
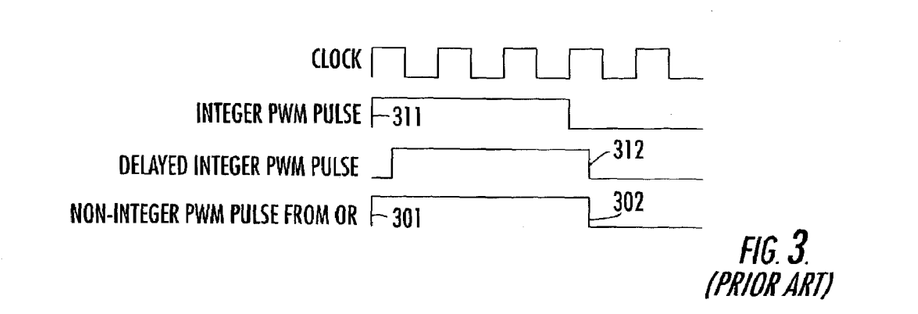
FIG. 3 is timing diagram associated with the tapped delay line-based digital PWM pulse generator of FIG. 2.

A proposed analog technique to address this problem is to employ a tapped delay line-based digital PWM pulse generator of the type shown in FIG. 2, an associated timing diagram for which is illustrated in FIG. 3. In accordance with this approach, an Integer PWM Pulse that encompasses a prescribed number P of clock cycles of a reference clock signal CLOCK is applied to a multistage delay line 200 that contains a plurality of cascaded delay stages 200-1, 200-2, . . . , 200-N (each of which may be comprised of a pair of (MOSFET) inverter stages). The delay time through each delay stage corresponds to the minimum time resolution or granularity by which the PWM pulse may be adjusted.

The output of each delay stage is coupled to a respective input of a N+1:1 signal selector 210, which has its output coupled to one input of an OR gate 220. A second input of the OR gate 220 is coupled to receive the Integer PWM Pulse. As a result, OR gate 220 logically OR's the Integer PWM Pulse with the output of whichever delay stage 200-j is selected in accordance with a fractional delay select signal coupled to the select input 212 of signal selector 210.

Depending upon the delay Di imparted by each delay stage, and depending upon which jth one of its inputs is selected, signal selector 210 will produce a version of the Integer PWM Pulse as a Delayed Integer PWM Pulse delayed by j×Di. Logically ORing the Integer PWM Pulse and the Delayed Integer PWM Pulse produces a Non-Integer PWM Pulse having a front edge (e.g., rising edge) 301 that is coincident with the front edge (e.g., rising edge) 311 of the Integer PWM Pulse and a termination (e.g., falling edge) 302 that is coincident with the termination (e.g., falling edge) 312 of the Delayed Integer PWM Pulse.

Although the fractional delay scheme of FIG. 2 provides a potentially effective solution to the PWM digital resolution problem, it is limited by a number of practical considerations, such as differences among fabrication runs of its integrated circuit manufacturing process, and operational variations, such as changes in temperature and/or supply voltage. In accordance with the invention disclosed in the above-referenced '836 application, such shortcomings can be substantially reduced by a PLL-configured, or 'pseudo' PLL-configured, fractional clock pulse generator, whose operational (delay stage) parameters are adjusted as necessary to maintain a desired fractional precision of the duty-cycle of a generated PWM clock pulse signal.

Figure 4:
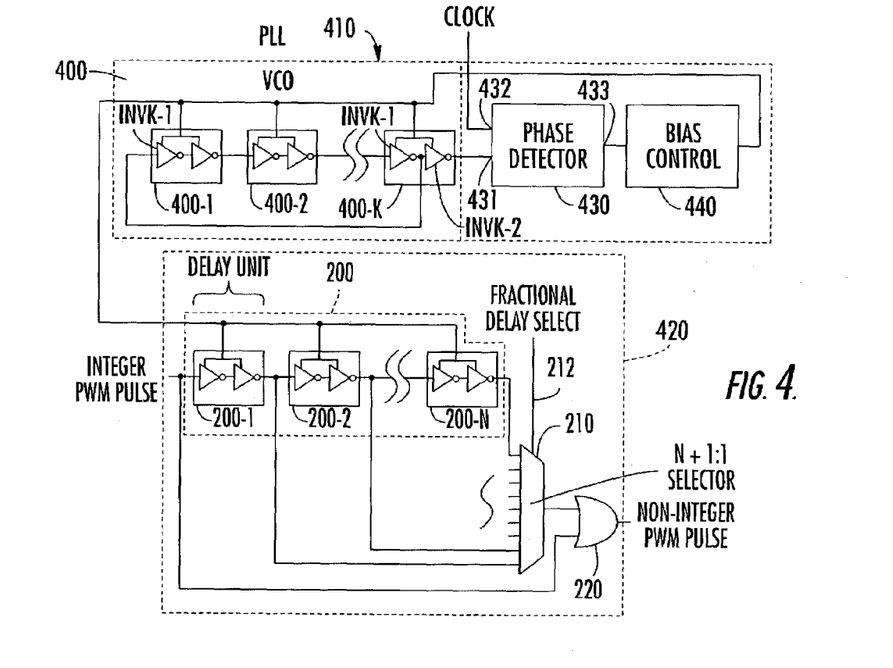
FIG. 4 diagrammatically illustrates a closed loop (PLL-based) tapped delay line-configured digital PWM pulse generator in accordance with a first embodiment of the invention.

In accordance with a first, closed-loop, PLL approach, shown diagrammatically in FIG. 4, the tapped delay line-based digital PWM pulse generator of FIG. 2 is augmented to include a compensating phase locked-loop, that is formed around an auxiliary tapped delay line 400, which implements the voltage controlled oscillator (VCO) component of a PLL. One or more parameters (e.g., layout geometries) of the respective delay line stages of the auxiliary delay line 400 have a predetermined relationship with respect to those of the PWM delay line 200, based upon the desired operating characteristics of the PWM pulse generator, as well as desired performance of the PLL.

To facilitate digital processing applications, it is preferred, but not required, that the granularity of the duty-cycle of the PWM pulse be adjustable in fractions that are an integer power of 2 (e.g., by one-sixteenth of a clock cycle). On the other hand, the nominal inverting delay of the PLL should be a prime number fraction (e.g., one-seventeenth of a clock cycle), to prevent the generation of harmonics in the PLL. To accommodate both of these objectives, properties (e.g. geometries) of the delay stages of the auxiliary delay line 400 of the PLL are appropriately correlated with those of PWM delay line 200, so that the same operational adjustment parameter (e.g., bias voltage) can be used to produce slightly different precisely correlated delays in the respective stages of the two delay lines.

The auxiliary tapped delay line 400 includes a plurality of cascaded delay line stages 400-1, 400-2 . . . , 400-K, the number and configuration of each of which correspond to those of tapped delay line 200, so that the auxiliary tapped delay line 400 may be considered to be an effective 'copy' of the tapped delay line 200 of FIG. 2. To implement a VCO, the output of a first inverter INVK-1 of the Kth delay stage 400-K of delay line 400 is fed back to the input of the first inverter INV1-1 of its first delay stage 400-1, so as to form a 'ring'-configured, delay stage-based oscillator, which produces an output clock frequency which the PLL can lock to the clock signal CLOCK. The output of a second inverter INVK-2 of the Kth delay stage 400-K is coupled to a first input 431 of a phase detector 430, which has a second input 432 coupled to receive the clock signal CLOCK. The CLOCK period is approximately equal to the nominal delay of the full PLL delay line (400); thus under nominal conditions the PLL delay line will impose a one clock cycle delay on the CLOCK signal.

As in a conventional PLL, the output 433 of phase detector 430 provides a phase error signal that is used to adjust the operation of the tapped delay line-implemented VCO 400. As a non-limiting example, this phase error adjustment path is shown as comprising a bias voltage control unit 440, which controls the DC bias voltage applied to each of the delay stages of the delay line VCO 400. The output of the bias voltage control unit 440 is also used to control the DC bias voltage applied to the delay stages of tapped delay line 200 within PWM pulse generator 420.

Since the respective delays imparted by the delay stages of the auxiliary PLL delay line 400 are appropriately correlated with those of the delay stages of the PWM tapped delay line 200, then whatever adjustment is carried out in the PLL 410 to lock its tapped delay line (VCO) 400 to the reference CLOCK causes an associated adjustment of the delays of the delay line stages of the PWM pulse generator 420, and thereby provides a high precision fractional adjustment of the duty-cycle of the Integer PWM Pulse that is effectively independent of processing variations and operational parameters such as temperature and supply voltage.

Figure 5:
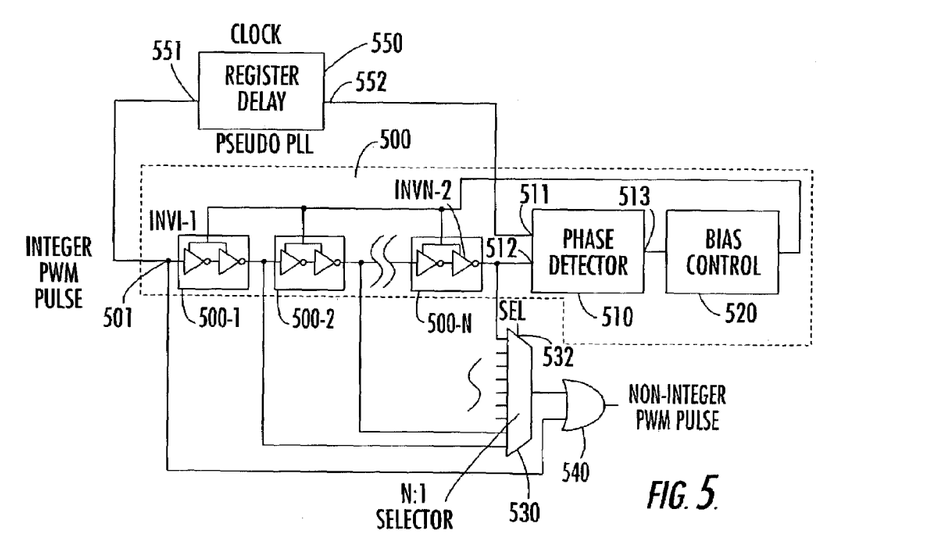
FIG. 5 diagrammatically illustrates an open loop pseudo-PLL tapped delay line-configured digital PWM pulse generator in accordance with a second embodiment of the invention disclosed in the above-referenced '836 application.

According to a second 'pseudo PLL' open loop approach, shown diagrammatically in FIG. 5, the Integer PWM Pulse is coupled via input terminal 501 to a first inverter INV1-1 of a first delay stage 500-1 of a multistage tapped delay line 500. Being open loop, no delay stage of the delay line 500 has its output fed back to the delay line's input stage 500-1. The number of stages N of delay line 500 determines the resolution, or granularity, to which the system clock signal CLOCK may be divided, and nominally encompasses one cycle of the system clock signal. The Integer PWM Pulse is also input to a register delay 550 that imparts a single (PWM) system clock cycle delay to the Integer PWM Pulse producing the Unity Delayed Integer PWM Pulse. The Unity Delayed Integer PWM Pulse is applied to a first input 511 of a phase detector 510. The output of a second inverter INVN-2 of the Nth delay stage 500-N is coupled to a second input 512 of the phase detector 510.

In addition to being coupled in cascade between the Integer PWM Pulse input terminal 501 and the phase detector 510, the outputs of the N delay stages 500 are coupled to respective inputs of a N:1 signal selector 530, whose output is coupled to one input of an OR gate 540. A second input of the OR gate 540 is coupled to receive the Integer PWM Pulse. As in the embodiment of FIG. 4, OR gate 540 will logically OR the Integer PWM Pulse applied to input terminal 501 with the output of whichever delay stage 500-j is selected in accordance with a select signal coupled to the select input 532 of signal selector 530. Thus, the output of the OR gate 540 produces the PWM pulse whose leading edge is coincident with that of the Integer PWM Pulse and whose trailing edge is coincident with the trailing edge of the output of the selected delay stage.

Like the closed loop PLL embodiment of FIG. 4, the output 513 of the phase detector 510 provides a phase error signal that adjusts operational parameters of the delay stages of the tapped delay line 500. In particular, the output 513 of the phase detector 510 is coupled to a bias voltage control unit 520, which controls the bias voltage applied to each of the delay stages of the delay line 500. In the open loop 'pseudo PLL' embodiment of FIG. 5, however, phase detector 510 is referenced to the Unity Delayed Integer PWM Pulse, rather than the high frequency system clock CLOCK. The duration of the PWM output pulse is thereby determined by the system clock delay granularity imparted by a respective one of the delay line stages 500-*i*, and from which delay line stage output the PWM pulse signal is derived.

The phase detector 510 compares the Integer PWM Pulse digitally delayed by one CLOCK cycle connected to the first phase detector input 511 with the Integer PWM Pulse delayed by the full delay line 500 and connected to the phase detector second input 512. A phase error between the two delayed versions of the Integer PWM Pulse will cause the bias control unit 520 to adjust the delays of the respective stages of the delay line 500 to correct for the phase error. Because this bias voltage is coupled to each of the inverter pairs of the delay stages 500-1, 500-2, . . . , 500-N of the tapped delay line 500, the amount of delay imparted by each delay stage will be appropriately compensated, so that the selected fractional CLOCK cycle adjustment of the Integer PWM Pulse at the output of OR gate 540 will be maintained effectively independent of processing variations and operational parameters.

Although the PLL and 'pseudo PLL' based tapped delay line schemes of FIGS. 4 and 5, respectively, provide a substantial improvement over the non-PLL configured delay line architecture of FIG. 2, they are still essentially analog approaches in that the delay elements need to be designed to approximate a specific fraction of the CLOCK signal cycle. Moreover, they are not perfectly 'portable' among different semiconductor fabrication plants, whose manufacturing parameters can be expected to vary from facility to facility, and therefore require adjustment of the delay line layouts.

SUMMARY OF THE INVENTION

In accordance with the present invention, these and other shortcomings of analog component-based PWM generators are effectively obviated by a totally digitally-implemented PWM approach which employs digital error accumulation and correction at the point of origin of the PWM signal, which is well upstream of the relatively slow voltage control feedback loop. As a consequence, quantization errors are corrected before they can substantially accumulate in the output voltage.

One version of the present invention also employs variable switching frequency to allow PWM pulse duty-cycle to be defined as a rational number composed in the numerator as the number of clock cycles of 'on' time and in the denominator as the total number of clock cycles from one 'on' time initiation to the next. Allowing the denominator to vary leads to finer duty-cycle granularity, but in some applications the digital error correction must also constrain the time averaged switching frequency to the design nominal. Maintaining the time average of the switching frequency is critical for multiphase systems that must maintain an advantageous phase relationship (relative pulse timing) between the paralleled switching sections (e.g., the switching sections each composed of the two NFETs 30 and 40 and the inductor 50 of FIG. 1).

Pursuant to a first, fixed PWM switching frequency embodiment of the invention, the PWM control circuit is replaced by a digital PWM controller, which generates a multibit PWM control word in accordance with an output voltage-defining (e.g., step-down) command supplied from an associated command interface. The digital PWM command word consists of an integer portion (most significant bits) used to define the integer system clock cycles in the associated PWM pulse and a fractional portion (least significant bits) that corresponds to a non-realizable fraction of a system clock cycle. The most significant bits of the PWM control word are used to control turn-on and turn-off of the electronic power switching devices of a PWM switching circuit to which a powered load is coupled, as in the architecture of FIG. 1, described above. The least significant bits represent temporal resolution in excess of what the PWM generator can actually provide, but are necessary to maintain high digital resolution and correct for the PWM error generated in employing only the most significant bits in any individual PWM pulse.

The truncated fractional bits of the PWM control word do not participate in defining the on-time of the PWM pulse signal of the current pulse, and represent duty-cycle granularity error. The fractional bits are employed as error correction bits in the next cycle of the PWM signal, and prevent the control loop from accumulating a large error in the time average of the PWM generator's output.

When multiple phases are employed (parallel sets of the electronic switches 30 and 40 and inductor 50 joined at the common output 55 in FIG. 1), as is common to both reduce the current per phase and increase the effective switching frequency seen by the load, there are two options as to how to apply the error corrections. In the first case, each phase may be corrected for PWM pulse granularity independently of the other phases. However, since an increase of effective switching frequency in multiphase DC-DC converters is achieved by staggering the individual phase pulses across the fundamental switching cycle, a second approach may be desirable. In this second approach the PWM pulse granularity error correction is applied sequentially to the multiphase pulses such that the cumulative error of the aggregate of the phases is minimized. This speeds the response to errors, but couples the phases through the error correction actions.

As a non-limiting example a four-phase system applies uniform staggering of the phase PWM pulses. The first phase begins its PWM pulse at the start of the switching period. The second phase begins its PWM pulse one-fourth the switching cycle later, the third phase begins at one-half, and the last phase begins three-fourths of the way through the switching cycle. This sequence repeats every switching cycle. In the simplest approach to the PWM granularity correction methodology previously described, each phase is corrected independently. Each phase then maintains a time averaged PWM of the desired value. However, this delays the correction of the granularity error for one pulse by a full switching cycle, until the same phase that engendered the error generates its next pulse. A more complex approach applies a correction to the next phase's pulse. In the four-phase example the error in the PWM pulse of the first phase is applied to the correction for PWM pulse of the second phase. This error-correcting scheme makes the best use of a multiphase system. In such a system, the fractional bits propagate from one phase to another in a 'ripple' fashion, to correct for PWM duty-cycle error in the next phase.

However, one drawback of the 'ripple' error correction must be considered. Although the average PWM duty-cycle taken over all phases is error corrected, the accumulating error in any individual phase is unconstrained. This can lead to unacceptable current imbalance between phases (e.g., one phase carrying a disproportionately large current). Consequently, practical implementation of the 'ripple' correction requires a separate control loop to ensure current balance. Since active current balancing between phases is often employed to compensate for component variability (most notably between inductors) which also leads to current imbalance, the current balance correction needed for the 'ripple' PWM granularity error correction is not a practical detriment.

In a second embodiment of the invention, the digital resolution is improved relative to the first embodiment, by making the switching cycle of the PWM pulse signal variable, rather than fixed. Namely, the time between leading edges of PWM pulses, as well as the on-time, is allowed to vary. The result is that the duty-cycle for a given PWM pulse is P/D where both P and D are variable. This refinement in duty-cycle granularity is of particular importance in relatively large voltage step-down applications, where a small duty-cycle (e.g., on the order of 10%) is used to define the on-time of the PWM pulse signal. The ability to change the PWM switching frequency means that differential values of several to ten units, for example, may be added to or subtracted from the denominator's nominal value, to provide finer granularity.

A potential problem with the variable switching cycle method is the uncontrolled wander of the PWM switching times. While this may not be of concern in a single-phase system, it is a concern in a multiphase system, where the relative offsets among the various PWM phases must be maintained, so that the accumulated switching period error must be constrained near zero. The wander of each phase can be readily restricted, if the desired target value of the switching period or denominator D of each PWM pulse is adjusted in accordance with the cumulative deviation from the nominal PWM switching period.

The second embodiment forces cumulative errors in the both the duty-cycle and the switching cycle of the PWM signal to average to zero over time. Small deviations appear as changes in pulse width and jitter on the switching period. Time averaging makes this approach particularly suitable for multiphase PWM generator systems, as it bounds the individual phases to the optimum time-staggered or mutually spaced positions. Not constraining the variable period could cause the different phases to wander, owing to slightly different duty-cycle target values to balance the respective currents or just statistical accumulation of granularity error correction, and eventually become time-aligned—something which time averaging prevents. For time-averaging the switching period, each phase must be independent with respect to the switching period, accumulating its own cumulative switching period error δ about zero. The duty-cycle correction can still be accomplished by either treating each phase independently or by the 'ripple' correction described above.

DETAILED DESCRIPTION

Before detailing the high resolution, digital pulse width modulator of the present invention, it should be observed that the invention resides primarily in a prescribed arrangement of conventional digital circuits and components, and associated control software therefor. Consequently, the configuration of such circuits and components and software, and the manner in which they interface with associated analog components have, for the most part, been shown in the drawings by readily understandable block diagrams and flow charts, which show only those specific details that are pertinent to the present invention, so as not to obscure the disclosure with details which will be readily apparent to those skilled in the art having the benefit of the description herein. Thus, the block diagrams and flow charts of the Figures are primarily intended to show the major components of the invention in convenient functional groupings and operational flow sequences, whereby the present invention may be more readily understood.

Figure 6:
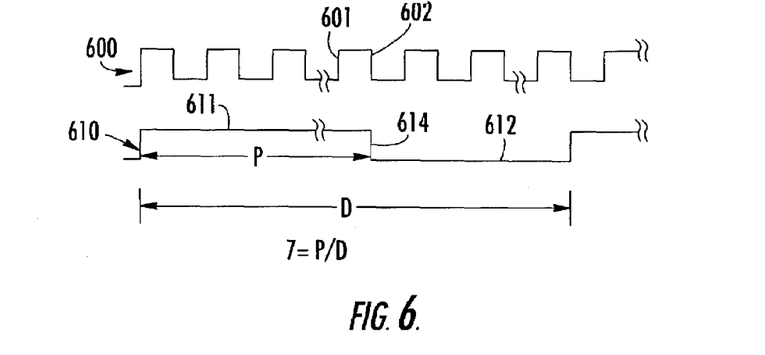
FIG. 6 is a timing diagram for illustrating the granularity of the duty-cycle error or offset of a PWM signal relative to a reference clock.

In order to facilitate an appreciation of the digitally based PWM duty-cycle granularity refinement mechanism of the present invention, attention is initially directed to the timing diagram of FIG. 6, which shows a system clock SYS CLK 600 and an associated PWM pulse signal 610. The duty-cycle of the PWM pulse signal 610 is the ratio of a first logical state or on-time 611 (P in FIG. 6) thereof relative to its period (D in FIG. 6), which is the sum of its on-time 611 with the subsequent second logical state or off-time 612. System clock 600 typically has a frequency that is considerably higher (e.g. on the order of two orders of magnitude greater) than PWM pulse signal 610 switching frequency (repetition rate for leading edge of the first logic state 611).

If the on-time duration 611 of the PWM signal 610 is constrained to be defined in accordance with (aligned with edges of) the system clock 600, then the finest PWM duty-cycle granularity (minimum error) that can be achieved will be the interval between two consecutive edges, one rising as 601 and one falling as 602, of the system clock, or one-half of the period of the system clock (assuming that the system clock is high-low symmetric (has a fifty percent duty-cycle)). A less aggressive digital scheme would employ a full clock cycle as the minimum time resolution and would remove the constraint on the clock high-low symmetry. The invention is equally applicable to both situations.

As this granularity error accumulates over successive PWM cycles (the running sum of the errors), it will be eventually fed back to the PWM controller in the form of an output voltage error, which adjusts the PWM on-time 611 in the opposite direction to compensate for the accumulated error. The time required for the PWM controller of a DC-DC converter to respond to the accumulated error depends upon the frequency response of the RLC feedback path through which the switching circuit's common node is monitored by the PWM controller. Because the cutoff frequency of the RLC filter path (which may be on the order of several ten to several hundred KHz) is considerably lower than the PWM switching frequency (which may be on the order of several hundred KHz to several MHz), a relatively long period of time is required before the error is fed back and corrected, which results in a substantial wander of the converter's output voltage, reducing performance.

As pointed out above, to circumvent this problem, the present invention configures the PWM generator as a software-based or digitally implemented controller. This digital controller is capable of forming each PWM pulse width as a rational number based on full cycles (or possibly half-cycles) of a PWM reference clock, while performing digital error accumulation and correction at the point of origin of the PWM signal—which is well upstream of the relatively slow voltage control feedback loop. As a consequence, quantization errors are effectively corrected before they are able to accumulate in the output voltage, providing a significant improvement in performance.

Figure 7:
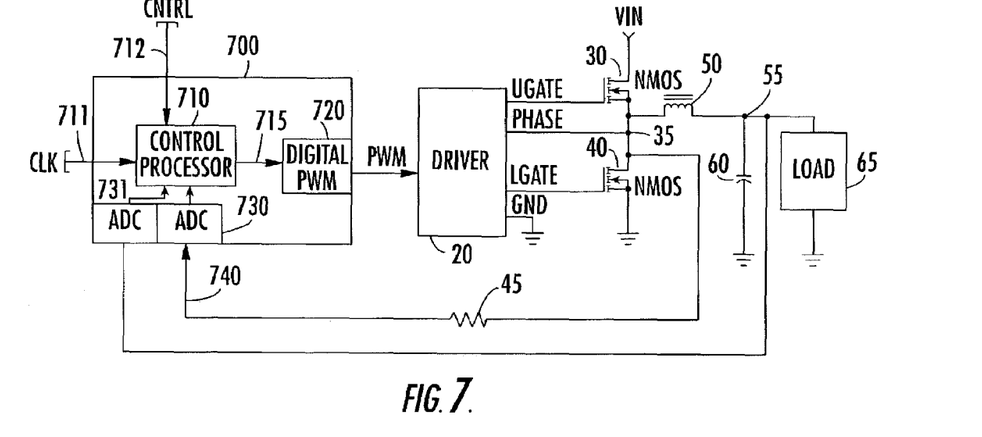
FIG. 7 shows a modification of the architecture of FIG. 1 in accordance with a first, fixed PWM switching frequency embodiment of the invention having a digital PWM controller.

More particularly, FIG. 7 shows a modification of the architecture of FIG. 1 in accordance with a first, fixed PWM switching frequency embodiment the invention, wherein the PWM control circuit 10 is replaced by a digital PWM controller 700. The digital PWM controller includes a control processor 710, which is clocked by a high frequency reference clock 711, and is operative to generate a multibit PWM control word in accordance with an output voltage-defining (e.g., step-down) command supplied to a DC-DC control input 712 from an associated command interface.

A prescribed number of most significant bits of the PWM control word are coupled over digital bus 715 to a digital pulse width modulator (PWM) 720 the output of which is coupled to switching circuit driver 20, for controlling turn-on and turn-off of the electronic power switching devices, to which a powered load is coupled, as in the architecture of FIG. 1, described above. The digital PWM only operates on a subset (most significant bits) of the bits in the command word such that the command word from the control processor represents a pulse width of resolution finer than the PWM can actually produce.

The remaining or truncated (least significant or fractional) bits of the PWM control word, that do not participate in defining the on-time of the PWM pulse signal and thereby represent duty-cycle granularity error, are combined in the control processor with the output of analog-to-digital converters (ADC) 730 and 731, which provide the feedback information from the power output nodes at 35 and 55. Because these error bits are employed in the very next cycle of the PWM signal, they prevent the control loop from accumulating a large amount of error in the time average of the PWM generator's output.

Figure 8:
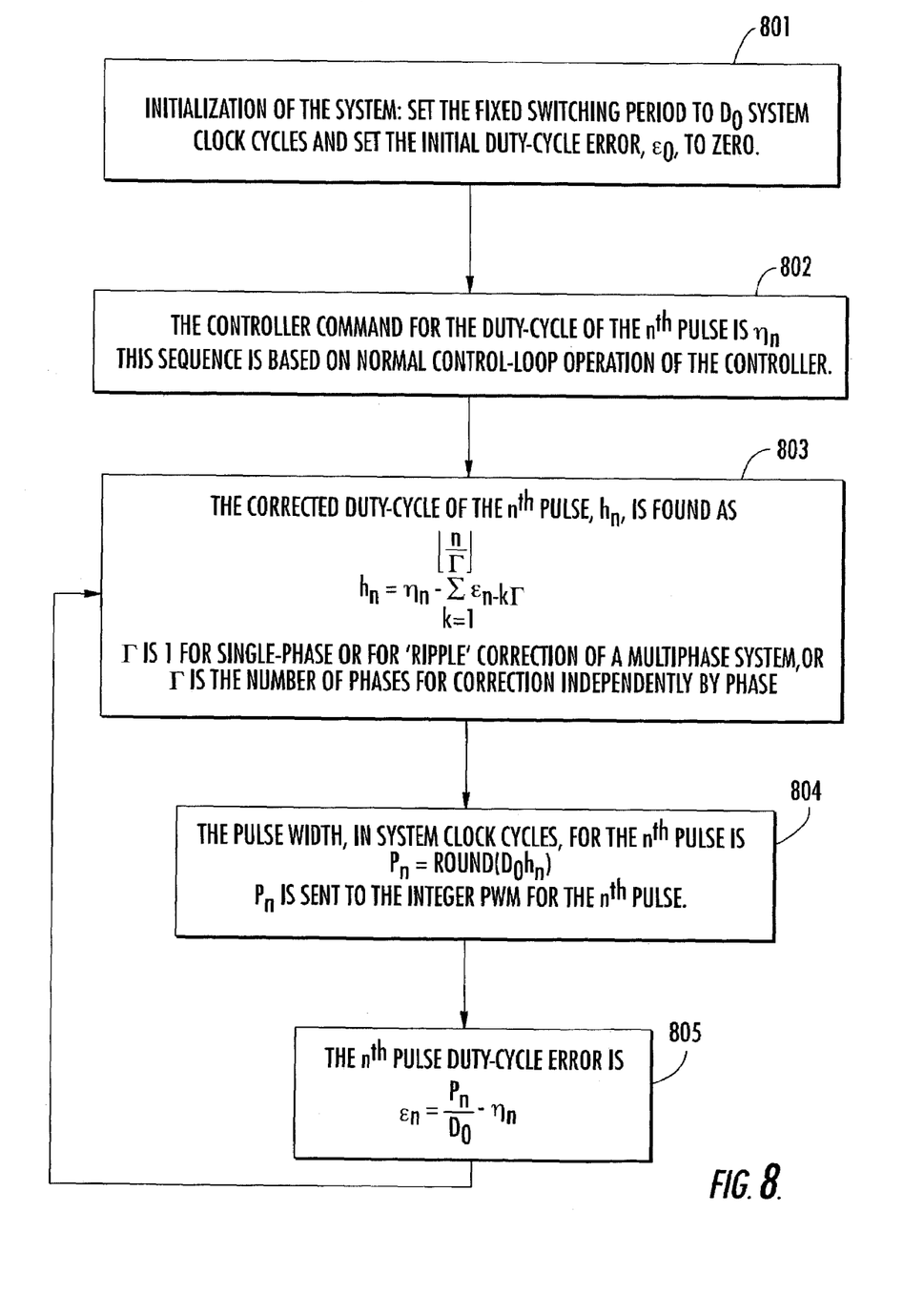
FIG. 8 is a flow chart associated with the operation of a fixed PWM switching frequency embodiment of the digital PWM controller of FIG. 7.

The control mechanism that is performed by the control processor 710 may be characterized as shown in the flow chart of FIG. 8. As noted above, the present embodiment of the invention is based upon a fixed PWM switching frequency, which may be defined as shown in step 801, as setting the fixed switching period to some fixed number $D_0$ of system clock cycles (or half-cycles). In addition, the initial duty-cycle error $\epsilon_0$ is set at zero. Next, as shown at step 802, the desired effective duty-cycle for the $n^{th}$ pulse, represented by all the bits of the PWM command, is set by the feedback control at $\eta_n$.

In step 803, the $n^{th}$ period corrected duty-cycle is defined in equation (1) as:

$$h_n = \eta_n - \sum_{k=1}^{\lfloor \frac{n}{\Gamma} \rfloor} \epsilon_{n-k\Gamma} \quad (1)$$

where $\Gamma$ is set to the number of phases for independent correction of phases or set to 1 for the 'ripple' type correction of duty-cycle. With $\Gamma$ equal to the number of phases, the summation only contains errors generated by the current phase. With $\Gamma$ equal to 1 the summation includes all previous errors from all phases. (The lower half brackets, $\lfloor \; \rfloor$, indicate a "round" function corresponding to the largest integer smaller than the quantity within the brackets.) As an alternative the "round" function may be replaced with a "floor" function (largest integer smaller than the argument) or a "ceiling" function (smallest integer larger than the argument) without a loss in generality.

In step 804, the pulse width $P_n$, in system clock cycles (or half-cycles), for the $n^{th}$ period is defined as:

$$P_n = \text{round}(D_0 \eta_n h_n) \quad (2).$$

Next, in step 805, the $n_{th}$ period duty-cycle error $\epsilon_n$ is defined as:

$$\epsilon_n = P_n/D_n - \eta_n \quad (3)$$

The routine then returns from step 805 to step 803 for the next period.

As pointed out above, by employing the fractional bits of the PWM control word in the next cycle of the PWM signal, the control loop cannot accumulate a large amount of error in the time average of the PWM generator's output. This error correcting property of the fractional bits becomes particularly useful in a multiphase system. In such a system the fractional bits may be propagated from one phase to another ($\Gamma$=1) Namely, rather than use the fractional bits in the same phase, they are employed to correct for PWM duty-cycle error in the next phase.

Figure 9:
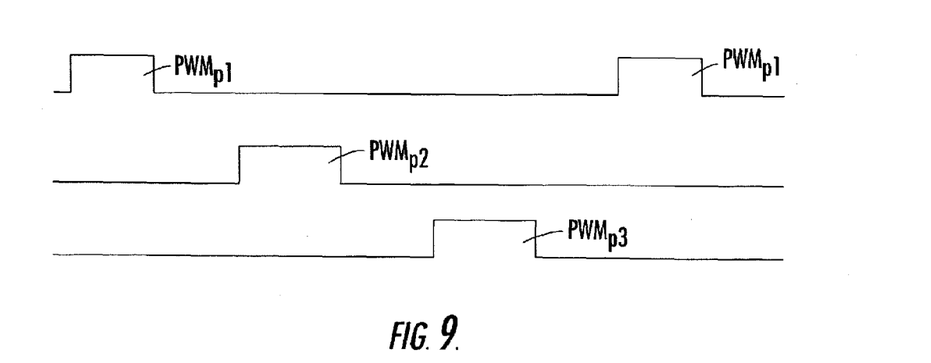
FIG. 9 diagrammatically illustrates a set of three-phase PWM pulses.

As a non-limiting example, consider the fixed frequency, three-phase PWM pulse signals diagrammatically illustrated in FIG. 9. As shown therein, the fractional bits associated with a first PWM phase ($\text{PWM}_{p1}$) are coupled to the control loop for the next PWM phase ($\text{PWM}_{p2}$), and the fractional bits associated with the second PWM phase ($\text{PWM}_{p2}$) are coupled to the control loop for the third phase next PWM phase ($\text{PwM}_{p3}$). Similarly, the fractional bits associated with the third PWM phase ($\text{PWM}_{p3}$) are coupled or 'wrapped' back to the control loop for the first PWM phase ($\text{PWM}_{p1}$), and so on. The duty-cycle error is thus corrected at the effective switching rate (the switching frequency times the number of phases) so that full advantage is taken of the higher effective switching rates in multiphase systems. If the phases were corrected independently, the correction rate would be at the switching cycle rate. As mentioned previously, the 'ripple' type correction does lead to the potential for current imbalance in the phases, so to use the 'ripple' mode correction a separate current balancing loop must be added to the control system. Since current balancing is also desired to compensate for phase component mismatch, the current balancing loop must be based on the actual currents determined independently from the PWM signals.

Pursuant to a second embodiment of the invention, the digital resolution can be improved very substantially (e.g., by an order of magnitude) relative to the first embodiment, by making the switching cycle of the PWM pulse signal variable, rather than fixed as in the embodiment of FIGS. 7–9, described above. Namely, the switching cycle (time between the leading edges of two consecutive pulses), as well as the on-time, is allowed to vary in defining an expression for duty-cycle. This refinement in duty-cycle granularity is of particular importance in relatively large voltage step-down applications, such for as a 10:1 step down of a 12 VDC supply voltage to a 1.2 VDC output voltage, where a relatively small duty-cycle (e.g., on the order of 10%) is used to define the on-time of the PWM pulse signal.

As an illustrative example, for the case of a fixed frequency PWM signal whose nominal on-time and off-time sums to 100 increments (clock cycles), changing only the on-time (numerator) by a value of one about a nominal value of ten would provide a duty-cycle variation on the order of ten percent (e.g., a value of 9 in the numerator is one percent less than, and a value of 11 in the numerator is one percent higher than the nominal ten percent value of 10/(10+90)). However, providing the ability to independently change the PWM switching frequency (the off-time portion of the denominator) means that differential values of several to ten units, for example, could be added to or subtracted from the denominator's value of 100 nominal, to provide a much finer duty-cycle granularity.

Thus, for the present example of a times-ten step down, increasing or decreasing the off-time component of the denominator by a value of one yields a duty-cycle variation on the order of one-tenth of one percent. Namely, increasing the off-time component of the denominator by a value of one yields a duty-cycle of 10/(10+91) or a duty-cycle of 9.9%, while decreasing the off-time component of the denominator by a value of one yields a duty-cycle of 10/(10+89) or a duty-cycle of 10.1%.

For the present embodiment of a variable frequency PWM generator, the duty-cycle granularity for nearest PWM duty-cycle realizations are defined as:

P/(D−1), P/D and P/(D+1), which may be rewritten as:

(P/D)(1/(1−(1/D))), (P/D), and (P/D) (1/1(+(1/D)))    (4).

For D>>1, the expression (4) may be approximated as:

(P/D)(1+(1/D)), (P/D), and (P/D) (1−(1/D))    (5).

In this case the fractional granularity of the realized duty-cycle is approximately 1/D. For a ten percent duty-cycle and a nominal 100 clock cycles in the switching cycle, there is a times-ten improvement in resolution. A potential problem is the uncontrolled wander of the PWM switching times. While this is not a concern in a single-phase system, it is in a multiphase system, where the relative offsets among the various PWM phases must be maintained, as described above, so that the accumulated switching period error must be constrained near zero.

The wander of each phase can be readily restricted, if the desired target value of the switching period or denominator D of each PWM pulse is adjusted in accordance with the cumulative deviation from the nominal PWM switching period $D_0$. In the present variable PWM switching frequency embodiment, the control mechanism performed by the control processor may be characterized as shown in the flow chart of FIG. 10.

Figure 10:
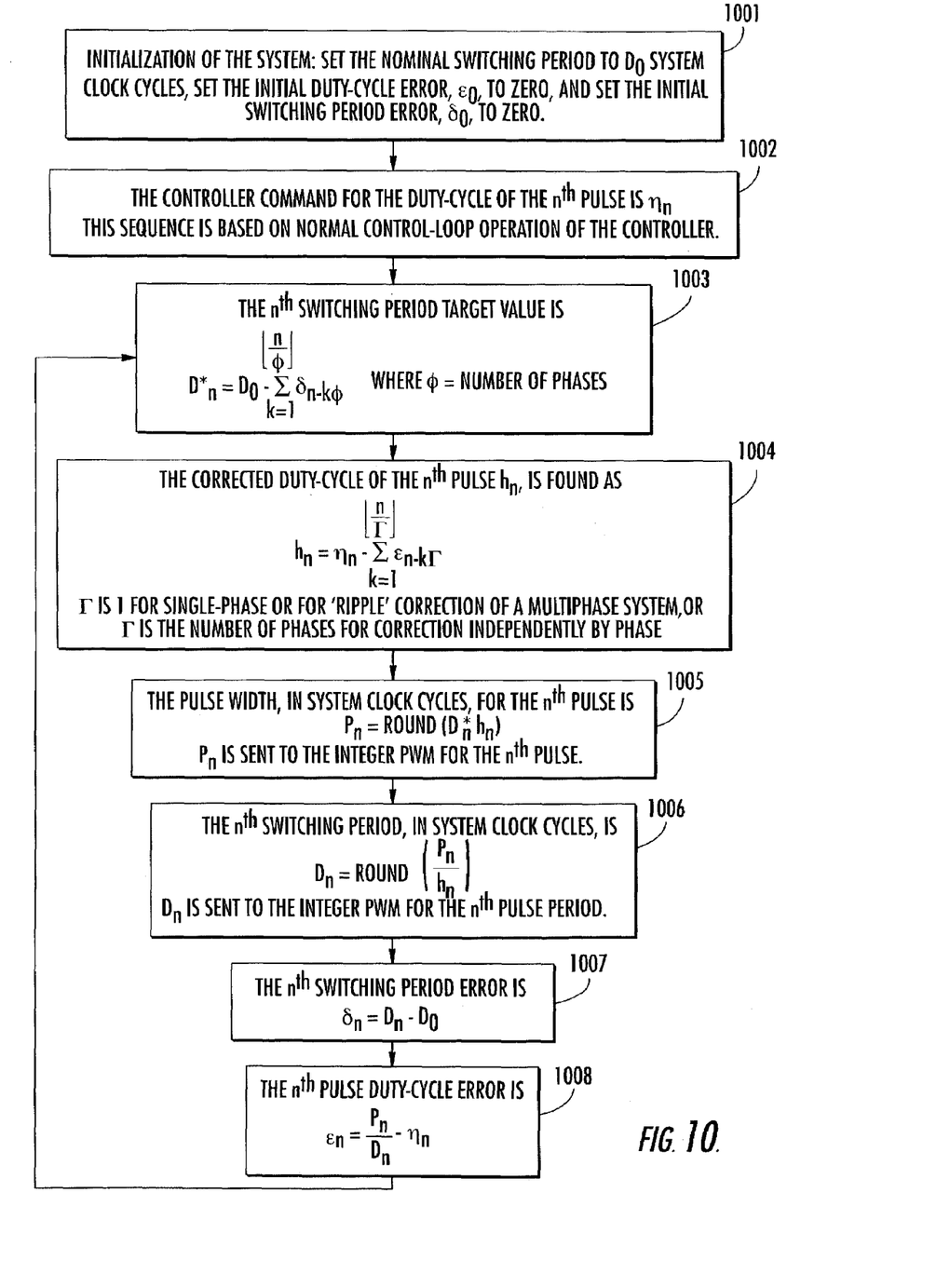
FIG. 10 is a flow chart associated with the operation of a variable PWM switching frequency embodiment of the digital PWM controller of FIG. 7.

In step 1001, in addition to setting the PWM initial switching frequency to some fixed number $D_0$ of system clock cycles (or half-cycles), the initial period error $\delta_0$ and the initial duty-cycle error $\epsilon_0$ are set to zero. Next, in step 1002, the desired effective duty-cycle $\eta_n$ for each pulse is generated by the controller In step 1003, the desired $n^{th}$ period duty-cycle is defined in equation (6) as:

$$D_n^* = D_0 - \sum_{k=1}^{\lfloor \frac{n}{\Phi} \rfloor} \delta_{n-k\Phi} \quad (6)$$

where $\Phi$ is the number of phases in the system. The summation of switching period errors only includes those errors from previous cycles of the current phase. This ensures that each phase is independently corrected for switching period. (The lower half brackets, $\lfloor \ \rfloor$, indicate the largest integer smaller than the quantity within the brackets.)

In step 1004, the $n^{th}$ period corrected duty-cycle $h_n$ is defined as:

$$h_n = \eta_n - \sum_{k=1}^{\lfloor \frac{n}{\Gamma} \rfloor} \varepsilon_{n-k\Gamma} \quad (7)$$

where $\Gamma$ is set to the number of phases for independent correction of phases or set to 1 for the 'ripple' type correction of duty-cycle. With $\Gamma$ equal to the number of phases, the summation only contains errors generated by the current phase. With $\Gamma$ equal to 1 the summation includes all previous errors from all phases. (The lower half brackets, $\lfloor \ \rfloor$, indicate the largest integer smaller than the quantity within the brackets.)

In step 1005, the pulse width $P_n$, in system clock cycles, for the $n^{th}$ period is defined as:

$P_n = \text{round}(D^*_0 h_n)$    (8).

In step 1006 the final period length for the $n^{th}$ period is defined as:

$D_n = \text{round}(P_n/h_n)$    (9).

In step 1007, the $n^{th}$ period length error $\delta_n$ is defined as:

$\delta_n = D_n - D_0$    (10).

In step 1008, the $n^{th}$ period duty-cycle error is defined as:

$\epsilon_n = P_n/D_n - \eta_n$    (11)

The routine then returns from step 1008 to step 1003 for the next period.

The routine of FIG. 10 forces cumulative errors in the duty-cycle and switching cycle of the PWM signal to average to zero over time. Small deviations appear as changes in pulse width and jitter on the switching period. Time averaging of the switching period makes this approach particularly suitable for multiphase PWM generator systems, as it bounds the individual phases to the optimum time-staggered or mutually spaced positions. Not constraining the variable period in this manner could cause the different phases to wander—, and eventually become time-aligned—which time-averaging prevents.

In a multiphase system each PWM phase could be controlled by its own dedicated routine, rather than feeding the error from one phase to another ($\Gamma$=1). Indeed, for time-averaging the switching period, it is necessary that each phase be independent, accumulating its own cumulative switching period error about zero. The duty-cycle error can be treated either independently for each phase (Γ=number of phases), or it can be 'rippled' from one phase to another (Γ=1) as explained in the first embodiment.

As will be appreciated from the foregoing description, shortcomings of analog component-based PWM generators are effectively obviated by the totally digitally-implemented PWM generator of the present invention, which forms each PWM pulse width as a rational number based on full cycles (or half-cycles) of a PWM reference clock, and offers a very high effective resolution of the PWM pulse signal that is compatible with multiphase DC-DC converters. Being totally digital allows digital error accumulation and correction to occur at the point of origin of the PWM signal, well upstream of the relatively slow voltage control feedback loop. As a result, quantization errors are corrected before they can accumulate in the converter's DC output voltage.

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A method of high resolution pulse width modulation, comprising the steps of:
    (a) splitting a plurality of digital code words, each into a most significant bits portion and a least significant bits portion;
    (b) generating a plurality of pulse width modulation (PWM) signals having at least one prescribed pulse width parameter defined at least in part in accordance with respective ones of said most significant bits portion, wherein a first of said plurality of PWM signals has a first pulse width parameter defined by a first of said most significant bits portion; and
    (c) generating a next of said plurality of PWM signals, said next PWM signal having an associated pulse width parameter based on a next of said most significant bits portion adjusted by said first least significant bits portion.

2. The method according to claim 1, wherein said most significant bits portion represents integer counts of a system clock signal and said least significant bits portion represents fractional clock cycle adjustments to said pulse width parameter.

3. The method according to claim 2, wherein said pulse width parameter is changed for each clock cycle of said system clock signal.

4. The method according to claim 1, wherein step (a) comprises generating respective sequences of digital code words associated with respectively different phases of PWM signals, each of which has a most significant bits portion and a least significant bits portion, step
    (b) comprises generating associated sequences of pulse width modulation (PWM) signals for a respectively different phases having respective prescribed pulse width parameters thereof respectively defined in accordance with most significant bits portions of said respective sequences of digital code words, and step
    (c) comprises adjusting prescribed pulse width parameters of PWM signals of a first of said respectively different phases in accordance with least significant bits portions of digital code words associated with PWM signals of a second of said respectively different phases.

5. The method according to claim 1, wherein
    a respective one of said PWM signals has a switching period comprised of a number $D_0$ of system clock cycles, and a control loop command duty-cycle $\eta_n$ for the $n^{th}$ pulse,
    the corrected $n^{th}$ pulse duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ may be selected to be either 1 or the number of independent PWM signal channels (phases),
the pulse width $P_n$, in system clock cycles, for the $n^{th}$ period is defined as:

$P_n = \text{round}(D_0 h_n)$, and
the $n^{th}$ period duty-cycle error $\varepsilon_n$ is defined as:

$\varepsilon_n = P_n/D_0 - \eta_n$.

6. The method according to claim 1, wherein a respective one of said PWM signals has an initial frequency with a period equal to a number $D_0$ of system clock cycles, the initial period error $\delta_0$ of which is set to zero,
    the initial duty-cycle error $\varepsilon_n$ is set at zero,
    the control loop command duty-cycle is $\eta_n$ for the $n^{th}$ pulse,
    the $n^{th}$ pulse switching cycle target value is defined as:

$$D_n^* = D_0 - \sum_{k=1}^{\lfloor \frac{n}{\Phi} \rfloor} \delta_{n-k\Phi}$$

where $\Phi$ is the number of phases,
the $n^{th}$ pulse corrected duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ may be selected to be either 1 or the number of independent PWM signal channels (phases),
the pulse width $P_n$, in system clock cycles, for the $n^{th}$ period is defined as:

$P_n = \text{round}(D_n^* h_n)$, the final period length for the $n^{th}$ pulse is defined as:

$D_n = \text{round}(P_n/h_n)$, the $n^{th}$ pulse duty-cycle error is defined as:

$\varepsilon_n = P_n/D_0 - \eta_n$, and
the $n^{th}$ period length error $\delta_n$ is defined as:

$\delta_n = D_n - D_0$.

7. The method according to claim 1, wherein
a respective one of said PWM signals has a switching period comprised of a number $D_0$ of system clock cycles, and a control loop command duty-cycle $\eta_n$ for the $n^{th}$ pulse,
the corrected $n^{th}$ pulse duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ may be selected to be either 1 or the number of independent PWM signal channels (phases),
the pulse width Pn, in system clock cycles, for the $n^{th}$ period is defined as:

$$P_n = \text{floor}(D_0 h_n),$$

and
the $n^{th}$ period duty-cycle error $\epsilon_n$ is defined as:

$$\epsilon_n = P_n/D_0 - \eta_n.$$

8. The method according to claim 1, wherein a respective one of said PWM signals has an initial frequency with a period equal to a number $D_0$ of system clock cycles, the initial period error $\delta_0$ of which is set to zero,
the initial duty-cycle error $\epsilon_0$ is set at zero,
the control loop command duty-cycle is $\eta_n$ for the $n^{th}$ pulse,
the $n^{th}$ pulse switching cycle target value is defined as:

$$D_n^* = D_0 - \sum_{k=1}^{\lfloor \frac{n}{\Phi} \rfloor} \delta_{n-k\Phi}$$

where $\Phi$ is the number of phases,
the $n_{th}$ pulse corrected duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ may be selected to be either 1 or the number of independent PWM signal channels (phases),
the pulse width $P_n$, in system clock cycles, for the $n^{th}$ period is defined as:

$$P_n = \text{floor}(D_n^* h_n),$$

the final period length for the $n^{th}$ pulse is defined as:

$$D_n = \text{floor}(P_n/h_n),$$

the $n^{th}$ pulse duty-cycle error is defined as:

$$\epsilon_n = P_n/D_n - \eta_n,$$

and
the $n^{th}$ period length error $\delta_n$ is defined as:

$$\delta_n = D_n - D_0.$$

9. The method according to claim 1, wherein
a respective one of said PWM signals has a switching period comprised of a number Do of system clock cycles, and a control loop command duty-cycle $\eta_n$ for the $n^{th}$ pulse,
the corrected $n^{th}$ pulse duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ may be selected to be either 1 or the number of independent PWM signal channels (phases),
the pulse width $P_n$, in system clock cycles, for the $n^{th}$ period is defined as:

$$P_n = \text{Ceiling}(D_0 h_n),$$

and
the $n^{th}$ period duty-cycle error $\epsilon_n$ is defined as:

$$\epsilon_n = P_n/D_0 - \eta_n.$$

10. The method according to claim 1, wherein a respective one of said PWM signals has an initial frequency with a period equal to a number $D_0$ of system clock cycles, the initial period error $\delta_n$ of which is set to zero,
the initial duty-cycle error $\epsilon_0$ is set at zero,
the control loop command duty-cycle is $\eta_n$ for the $n^{th}$ pulse,
the $n^{th}$ pulse switching cycle target value is defined as:

$$D_n^* = D_0 - \sum_{k=1}^{\lfloor \frac{n}{\Phi} \rfloor} \delta_{n-k\Phi}$$

where $\Phi$ is the number of phases,
the $n^{th}$ pulse corrected duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ may be selected to be either 1 or the number of independent PWM signal channels (phases),
the pulse width $P_n$, in system clock cycles, for the $n^{th}$ period is defined as:

$$P_n = \text{ceiling}(D_n^* h_n)$$

the final period length for the $n^{th}$ pulse is defined as:

$$D_n = \text{ceiling}(P_n/h_n),$$

and
the $n^{th}$ pulse duty-cycle error is defined as:

$$\epsilon_n = P_n/D_n - \eta_n$$

and
the $n^{th}$ period length error $\delta_n$ is defined as:

$$\delta_n = D_n - D_0.$$

11. The method according to claim 1, further including the step of:
(d) controlling a DC-DC converter in accordance with said PWM signals, said DC-DC converter being coupled to receive a supply voltage, and being operative to generate a regulated DC output voltage derived from said supply voltage, said DC-DC converter including a switching circuit containing electronic power switching devices coupled between respective power supply terminals, and controllably switched in accordance with said PWM signals, and having a common node thereof coupled to an output voltage terminal providing said regulated output voltage.

12. The method according to claim 11, wherein step (c) further comprises selectively adjusting switching times of said PWM signals.

13. The method according to claim 12, wherein step (c) comprises selectively adjusting prescribed time parameters and switching times of said PWM signals as necessary to effectively maintain a variation of a prescribed time parameter within a prescribed error tolerance over plural PWM signals.

14. The method according to claim 12, wherein step (c) comprises selectively adjusting prescribed time parameters and switching times of said PWM signals as necessary to effectively produce a zero time average of the digital PWM quantization error of a prescribed time parameter over plural PWM signals.

15. The method according to claim 14, wherein step (a) comprises generating respective sequences of digital code words associated with respectively different phases of PWM signals, each of which has a most significant bits portion and a least significant bits portion, step (b) comprises generating associated sequences of pulse width modulation (PWM) signals for said respectively different phases having prescribed time parameters thereof respectively defined in accordance with most significant bits portions of said respective sequences of digital code words, and step (c) comprises adjusting prescribed time parameters of PWM signals of a respective one of said different phases in accordance with least significant bits portions of digital code words associated with previous PWM signals of said respective one of said different phases.

16. The method according to claim 15, further including the step of:

(d) controlling a DC-DC converter in accordance with said PWM signals, said DC-DC converter being coupled to receive a supply voltage, and being operative to generate a regulated output voltage derived from said supply voltage, said DC-DC converter including a switching circuit containing electronic power switching devices, that are coupled between respective power supply terminals, and are controllably switched in accordance with said PWM signals, and having a common node thereof coupled to an output voltage terminal providing said regulated output voltage.

17. The method according to claim 1, wherein a respective one of said PWM signals has a fixed switching period comprised of a fixed number $D_0$ of system clock cycles, and a control loop command duty-cycle $\eta_n$ for the $n^{th}$ pulse, the corrected $n^{th}$ pulse duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma=1$, the pulse width $P_n$, in system clock cycles, for the $n^{th}$ period is defined as:

$P_n = \text{round}(D_0 h_n)$, and the $n^{th}$ period duty-cycle error $\varepsilon_n$ is defined as:

$\varepsilon_n = P_n/D_0 - \eta_n$.

18. The method according to claim 1, wherein a respective one of said PWM signals has a variable switching period comprised of a variable number of system clock cycles.

19. The method according to claim 1, wherein a respective one of said PWM signals has an initial frequency with a period equal to a number Do of system clock cycles, the initial period error $\delta_0$ of which is set to zero, the initial duty-cycle error $\varepsilon_0$ is set at zero, the control loop command duty-cycle is $\eta_n$ for the $n^{th}$ pulse, the $n^{th}$ pulse switching cycle target value is defined as:

$$D_n^* = D_0 - \sum_{k=1}^{\lfloor \frac{n}{\Phi} \rfloor} \delta_{n-k\Phi}$$

where $\Phi$ is the number of phases, the $n^{th}$ pulse corrected duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma=1$, the pulse width $P_n$, in system clock cycles, for the $n^{th}$ period is defined as:

$P_n = \text{round}(D_n^* h_n)$, the final period length for the $n^{th}$ pulse is defined as:

$D_n = \text{round}(P_n/h_n)$, the $n^{th}$ pulse duty-cycle error is defined as:

$\varepsilon_n = P_n/D_n - \eta_n$, and the $n^{th}$ period length error $\delta_n$ is defined as:

$\delta_n = D_n - D_0$.

20. The method according to claim 1, wherein a respective one of said PWM signals has a fixed switching period comprised of a fixed, number $D_0$ of system clock cycles, and a control loop command duty-cycle $\eta_n$ for the $n^{th}$ pulse, the corrected $n^{th}$ pulse duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ corresponds to the number of independent plural PWM signal channels (phases), the pulse width $P_n$, in system clock cycles, for the $n^{th}$ period is defined as:

$P_n = \text{round}(D_0 h_n)$, and the $n^{th}$ period duty-cycle errors n is defined as:

$\varepsilon_n = P_n/D_0 - \eta_n$.

21. The method according to claim 1, wherein a respective one of said PWM signals has an initial frequency with a period equal to a number $D_0$ of system clock cycles, the initial period error $\delta_0$ of which is set to zero, the initial duty-cycle error $\epsilon_0$ is set at zero, the control loop command duty-cycle is $\eta_n$ for the $n^{th}$ pulse, the $n^{th}$ pulse switching cycle target value is defined as:

$$D_n^* = D_0 - \sum_{k=1}^{\lfloor \frac{n}{\Phi} \rfloor} \delta_{n-k\Phi}$$

where $\Phi$ is the number of phases, the $n^{th}$ pulse corrected duty-cycle $h_n$ is defined as:

$$h_n = \eta_n - \sum_{k=1}^{\lfloor \frac{n}{\Gamma} \rfloor} \varepsilon_{n-k\Gamma}$$

where $\Gamma$ corresponds to the number of independent plural PWM signal channels (phases), the pulse width Pn, in system clock cycles, for the $n^{th}$ period is defined as:

$P_n = \text{round}(D_n^* h_n)$, the final period length for the $n^{th}$ pulse is defined as:

$D_n = \text{round}(P_n/h_n)$, the $n^{th}$ pulse duty-cycle error is defined as:

$\epsilon_n = P_n/D_n - \eta_n$ and the $n^{th}$ period length error $\delta_n$ is defined as:

$\delta_n = D_n - D_0$.

22. A method according to claim 1, wherein said prescribed parameter corresponds to duty cycle.

23. A method of generating a regulated direct current (DC) output voltage comprising the steps of:
(a) coupling a supply voltage to a DC-DC converter that is operative to generate a regulated output voltage derived from said supply voltage, said DC-DC converter having a pulse width modulation (PWM) generator which generates a PWM switching signal that switchably controls operation of a switching circuit containing electronic power switching devices coupled between respective power supply terminals, a common node thereof being coupled to an output voltage terminal; and
(b) controlling the operation of said PWM generator by
(b1) splitting a plurality of digital code words, each into a most significant bits portion and a least significant bits portion;
(b2) generating a plurality of pulse width modulation (PWM) signals having at least one prescribed pulse width parameter defined at least in part in accordance with respective ones of said most significant bits portions, wherein a first of said plurality of PWM signals has a first pulse width parameter defined by a first of said most significant bits portion; and
(b3) generating a next of said plurality of PWM signals, said next PWM signal having an associated pulse width parameter based on a next of said most significant bits portion adjusted by said first least significant bits portions.

24. The method according to claim 23, wherein step (b1) comprises generating said plurality of digital code words in accordance with said supply voltage.

25. The method according to claim 23, wherein said prescribed pulse width parameter corresponds to duty cycle.

26. An apparatus for generating a regulated direct current (DC) output voltage comprising:
a DC-DC converter that is operative to generate a regulated output voltage derived from said supply voltage, said DC-DC converter including a pulse width modulation (PWM) generator which generates a PWM switching signal that switchably controls operation of a switching circuit containing electronic power switching devices coupled between respective power supply terminals, a common node thereof being coupled to an output voltage terminal; and
a controller which is operative to control the operation of said PWM generator by splitting a plurality of digital code words, each into a most significant bits portion and a least significant bits portion, generating a plurality of pulse width modulation (PWM) signals having at least one prescribed pulse width parameters defined at least in part in accordance with respective ones of said most significant bits portion, wherein a first of said plurality of PWM signals has a first pulse width parameter defined by a first of said most significant bits portion; and generating a next of said plurality of PWM signals, said next PWM signal having an associated pulse width parameter based on a next of said most significant bits portion adjusted by said first least significant bits portion.

27. The apparatus according to claim 26, wherein said controller is operative to selectively adjust duty and switching cycles of said PWM signals as necessary to effectively maintain a variation of said duty-cycles within a prescribed error tolerance over plural PWM signals.

28. The apparatus according to claim 26, wherein said controller is operative to adjust the duty-cycle of one PWM signal in accordance with the least significant bits portion of a digital code word used to generate another PWM signal.

29. The apparatus according to claim 26, wherein said prescribed pulse width parameter corresponds to duty cycle.

* * * * *

UNITED STATES PATENT AND TRADEMARK OFFICE
CERTIFICATE OF CORRECTION

| | | |
|---|---|---|
| PATENT NO. | : 7,206,343 B2 | Page 1 of 1 |
| APPLICATION NO. | : 10/350599 | |
| DATED | : April 17, 2007 | |
| INVENTOR(S) | : Lawrence G. Pearce | |

It is certified that error appears in the above-identified patent and that said Letters Patent is hereby corrected as shown below:

In the claims:

Claim 21, column 19, line 25, replace "D* subscript n" with --D subscript n--.
Claim 23, column 20, lines 2 and 3, replace "portions" with --portion--.
Claim 23, column 20, line 10, replace "portions" with --portion--.
Claim 26, column 20, line 19, replace "said" with --a--.

Signed and Sealed this

Fifth Day of June, 2007

JON W. DUDAS
*Director of the United States Patent and Trademark Office*